United States Patent
Ayotte, Jr. et al.

(10) Patent No.: US 8,453,843 B1
(45) Date of Patent: Jun. 4, 2013

(54) TRAY FOR TRANSPORTING SEMICONDUCTOR DEVICES OF A BGA TYPE

(75) Inventors: Stephen Peter Ayotte, Jr., Burlington, VT (US); Timothy M. Sullivan, Essex, VT (US); Jacques Tetreault, Quebec (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/559,673

(22) Filed: Jul. 27, 2012

(51) Int. Cl.
*B65D 85/30* (2006.01)
*B65D 85/90* (2006.01)

(52) U.S. Cl.
USPC .......................................... 206/726; 206/562

(58) Field of Classification Search
USPC ................. 206/557, 558, 561, 562, 565, 710, 206/712, 725, 726
See application file for complete search history.

(56) References Cited

U.S. PATENT DOCUMENTS

| | | | |
|---|---|---|---|
| 5,551,572 A | 9/1996 | Nemoto | |
| 5,918,746 A | 7/1999 | Tokita et al. | |
| 6,179,127 B1 | 1/2001 | Kato et al. | |
| 6,914,771 B2 | 7/2005 | Ono et al. | |
| 6,981,595 B2 | 1/2006 | Brahmbhatt et al. | |
| 7,504,315 B2 | 3/2009 | Matsubara et al. | |
| 7,915,057 B2 | 3/2011 | Takahashi | |
| 8,017,434 B2 | 9/2011 | Lim et al. | |
| 2002/0003101 A1 | 1/2002 | Sembonmatsu et al. | |
| 2004/0012088 A1* | 1/2004 | Fukasawa et al. | 257/737 |
| 2005/0269242 A1* | 12/2005 | Crisp | 206/710 |
| 2009/0194872 A1* | 8/2009 | Wang et al. | 257/738 |

* cited by examiner

*Primary Examiner* — Jacob K Ackun
(74) *Attorney, Agent, or Firm* — Alexander Viderman; Anthony Canale

(57) ABSTRACT

The present invention relates to a tray for storing a semiconductor device of a ball grid array type. More specifically, a tray structure is provided, which includes a pocket formed in the tray for holding the semiconductor device, the pocket includes sidewalls having an upper portion and a lower portion, and a shelf portion located between the upper and lower portions of the sidewalls. The shelf portion extends horizontally inwardly from the upper portion of the sidewalls to support a portion of peripheral edges of the semiconductor device. The plurality of solder balls along the peripheral edges are spaced apart from the lower portion of the sidewalls of the pocket and an inner edge of the shelf portion when one of the opposing sides of the semiconductor device abuts the upper portion of the pocket.

16 Claims, 6 Drawing Sheets

TRAY FOR TRANSPORTING SEMICONDUCTOR DEVICES OF A BGA TYPE

BACKGROUND

Field of the Invention

The present invention relates to a tray for transporting semiconductor devices, and more particularly, to a tray for transporting semiconductor devices of a BGA type.

A BGA (ball grid array) type semiconductor device has been known as a three-dimensional mounting technology. A plurality of substantially sphere-shaped conductive terminals made of a metal such as solder is arrayed in a grid pattern on one principal surface of the BGA type semiconductor device and is electrically connected with the semiconductor die mounted on the other side of the package.

When the BGA type semiconductor device is mounted into electronic equipment, the semiconductor die and an external circuit on a printed circuit board are electrically connected by compression or thermal bonding of each of the conductive terminals to each of wiring patterns on the printed circuit board.

FIG. 1 shows one example of a conventional BGA type semiconductor device 100. Device 100 includes an upper side having an upper planar surface 102, opposing sides 103 and a bottom side with a bottom planar surface 104. Bottom surface 104 may include an array of ball contacts (terminals) 106 for mounting directly on a circuit board using conventional surface mounting techniques. Each ball contact 106 comprises a small substantially spherical solder ball.

FIG. 2 shows a plan (bottom) view of bottom surface 104 of the conventional BGA type semiconductor device of FIG. 1. As shown in FIG. 2, a plurality of solder balls 106 protrude from the bottom surface 104, including a plurality of solder balls 106a protruding from the bottom surface 104 along peripheral edges 108 of the semiconductor device 100. In the example of FIG. 2, the plurality of solder balls includes one hundred solder balls 106 and 106a arranged in a 10 by 10 array. However, the plurality of solder balls may include fewer or greater number of solder balls 106 and 106a arranged in any number of rows and columns.

Under the regulations of Restriction of Hazardous Substance (RoHS), purposed by the European Union (EU) in 2002, it is required that from Jul. 1, 2006, the consumer electronics products to be imported into any member state of EU shall be completely lead (Pb) free. Lead has been used in tin/lead solder for many years to perform a stabilizing and melting-temperature-control function. The RoHS directive prompted changes, in which "lead-free" alternative solders were developed for the electronic industry.

Among the various lead-free solder alloy choices as replacements of conventional tin-lead solders in BGA devices, Tin (Sn)-Silver (Ag)-Copper (Cu) alloys (also known as SAC alloys) are currently among the most popular because of their relatively good soldering performance, excellent creep resistance, and thermal fatigue reliability, as well as their compatibility with the current components. However, recent investigations on the lead-free solder alloys have shown that BGA devices made from these recommended SAC alloys may be fragile. These fragile BGA devices are very susceptible to damage, especially during testing and shipping.

A plate-like vessel, called a tray, is known as a vessel for storing semiconductor devices used when semiconductor devices (also known as semiconductor packages) are transported between steps of semiconductor manufacturing processes or shipped.

A plurality of recessed pockets (housing portions) for storing semiconductor devices are formed in the tray to be aligned in the form of a matrix. The respective semiconductor devices are stored in the pockets. When the tray is built up on another tray, a plurality of semiconductor devices can be stored.

Although most semiconductor devices are shipped in trays, numerous handling problems exist with the use of currently available trays. A primary problem with existing trays is inadequate protection of solder balls in the BGA type semiconductor devices during normal processing/handling and in shipping.

SUMMARY

In an aspect of the invention, a tray for storing a semiconductor device of a ball grid array type is provided. The semiconductor device has opposing sides and a bottom surface including a plurality of solder balls protruding from the bottom surface along peripheral edges of the semiconductor device. The tray comprises a pocket formed in the tray for holding the semiconductor device, the pocket includes sidewalls having an upper portion, a lower portion, and a shelf portion located between the upper and lower portions. The shelf portion extends horizontally inwardly from the upper portion to support a portion of the peripheral edges of the semiconductor device. The plurality of solder balls along the peripheral edges are spaced apart from the lower portion of the sidewalls of the pocket when one of the opposing sides of the semiconductor device abuts the upper portion of the pocket.

A more complete understanding of the present invention, as well as further features and advantages of the present invention, will be obtained by reference to the following detailed description and drawings. It is to be understood that both the foregoing general description and the following detailed description are exemplary and explanatory only, and should not be considered restrictive of the scope of the invention, as described and claimed. Further, features or variations may be provided in addition to those set forth herein. For example, embodiments of the invention may be directed to various combinations and sub-combinations of the features described in the detailed description.

BRIEF DESCRIPTION OF THE SEVERAL VIEWS OF THE DRAWINGS

The present invention is described in the detailed description which follows in reference to the noted plurality of drawings by way of non-limiting examples of exemplary embodiments of the invention.

DETAILED DESCRIPTION

The present invention relates to a tray for storing a semiconductor device of a ball grid array type. More specifically, an embodiment of the invention comprises a tray structure which includes a pocket formed in the tray for holding the semiconductor device, the pocket includes sidewalls having an upper portion and a lower portion, and a shelf portion located between the upper and lower portions of the sidewalls. The shelf portion extends horizontally inwardly from the upper portion of the sidewalls to support a portion of peripheral edges of the semiconductor device. The plurality of solder balls along the peripheral edges are spaced apart from the sidewalls of the pocket and an inner edge of the shelf portion when one of the opposing sides of the semiconductor device abuts the upper portion of the sidewalls of the pocket. Advantageously, the structure of disclosed embodiment of the invention is an improvement over prior art as a change in the shape of the shelf portion of the tray pocket results in an increased distance between the sidewalls of the pocket (or the shelf portion of the pocket) and the plurality of solder balls along the peripheral edges of the stored device.

Figure 3:
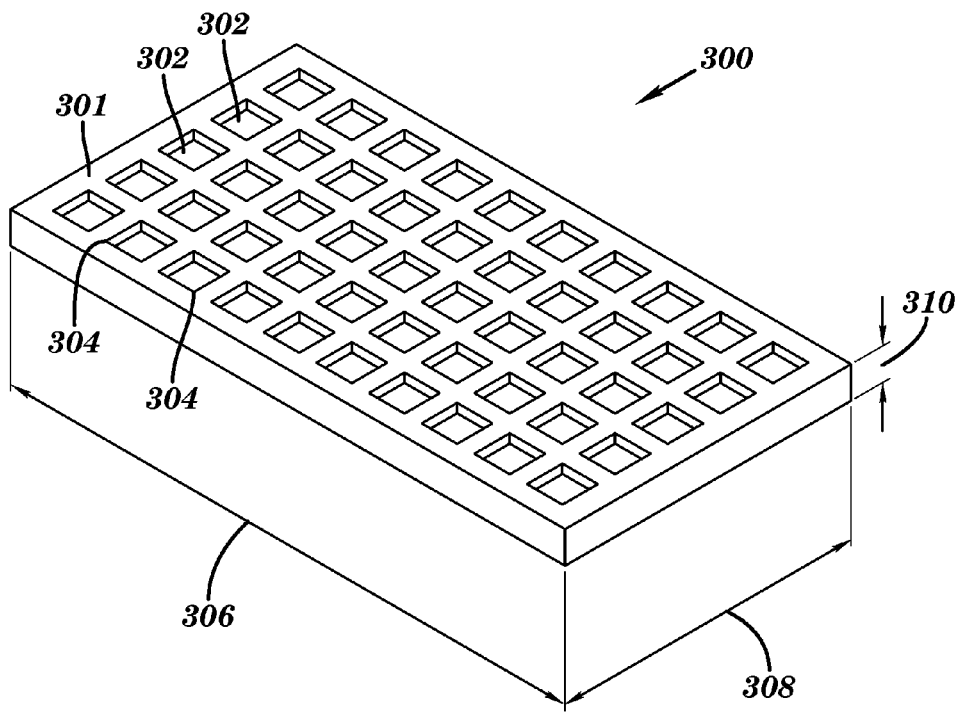
FIG. 3 shows a tray for storing the semiconductor device of FIG. 1, according to an embodiment of the invention.

Typically, prior to mounting on a circuit board, BGA devices are generally placed in a tray to be transported or subjected to tests. An example of a tray used for transporting semiconductor devices is shown in FIG. 3. Here, the term transport includes the transport of devices for various purposes, such as transport between steps, transport for shipping and the like.

Figure 1:
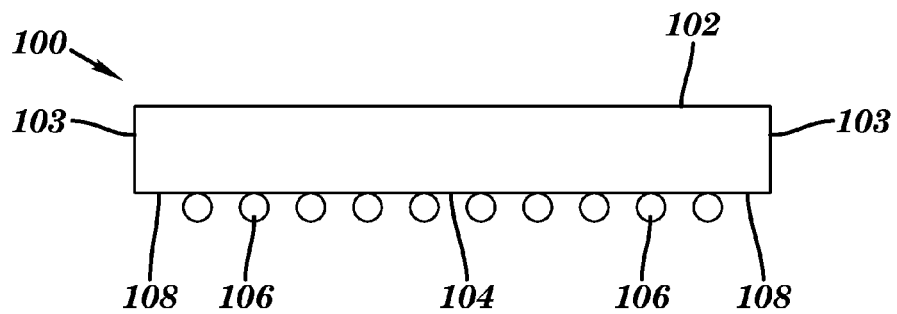
FIG. 1 is a profile of structure of a conventional BGA type semiconductor device.
Figure 2:
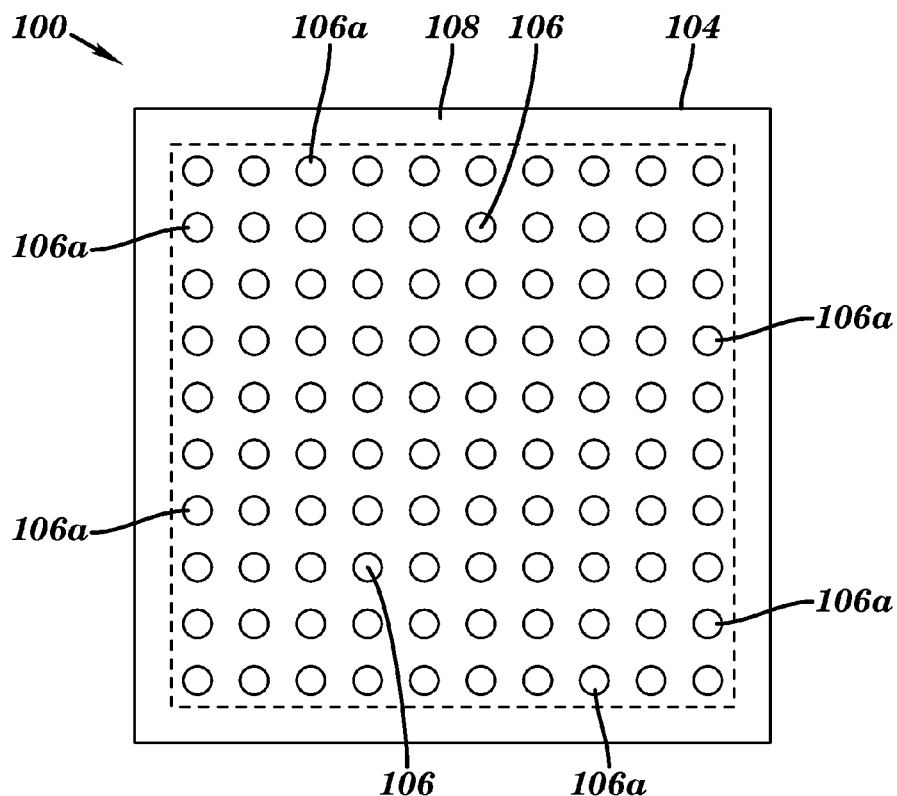
FIG. 2 shows a bottom view of the conventional BGA type semiconductor device of FIG. 1.

The tray 300 of this embodiment is a container which is used for transporting BGA devices, such as semiconductor device 100 of FIGS. 1-2. In this embodiment, the appearance of the tray 300 is configured to have a thin planar substantially rectangular shape. The profile size may be set such that the longitudinal size 306 is approximately 323 mm, the lateral width 308 is approximately 136 mm and the height 310 is approximately 8 mm.

In an embodiment, the tray 300 can be designed and built in compliance with standards propagated by the Joint Electronic Device Engineering Counsel (JEDEC). The tray 300 can be made by molding a material, for example, molten plastic, into the desired shape using conventional techniques. Various other materials may also be considered for the tray 300. From the viewpoint of suppressing or preventing electrostatic breakdown of the semiconductor devices by lowering the charging of devices with static electricity, the conventional material of the tray 300 may contain a hydrophilic polymer, for example. As a measure to cope with electrostatic breakdown, the addition of carbon into the material of the tray 300 and the formation of conductive patterning on the tray 300 may be considered.

On an upper surface 301 of the tray 300, a plurality of pockets 302, which are recessed in the direction substantially perpendicular to the upper surface 301, are arranged in a two-dimensional array. The pockets 302 are regions for storing the semiconductor devices. Each pocket 302 is adapted to hold a single device. Although, the exemplary tray 300 of FIG. 3 provides fifty (=5×10) pockets, the number of the pockets in the array is not specifically limited by this embodiment. According to an embodiment of the invention, each pocket 302 may be formed to have a planar substantially square shape, for example, wherein the planar size of each pocket 302 may range from approximately 15 mm×15 mm to approximately 55 mm×55 mm. Although, the shape and dimensions of the tray 300 and pockets 302 described above may be preferred and may comply with standards propagated by the JEDEC, the shape and dimensions are not limited to those of the exemplary embodiment illustrated in FIG. 3. For example, in an alternative embodiment, each pocket 302 may be formed to have a substantially rectangular shape.

Figure 4:
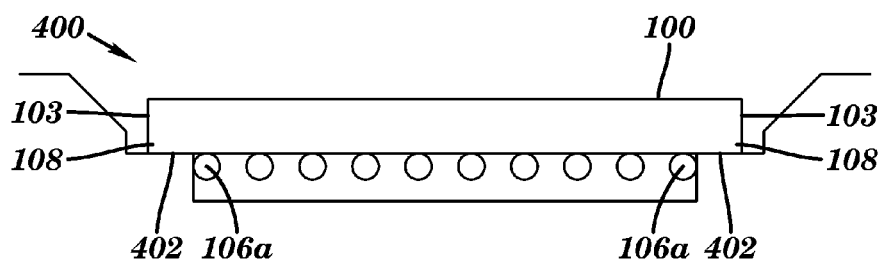
FIG. 4 is a cross-sectional view of a conventional pocket of the tray of FIG. 3.

FIG. 4 is a cross-sectional view of a conventional pocket of the tray of FIG. 3. The conventional pocket 400 supports the peripheral portion (a portion outside the outermost ball terminals 106a indicated by reference numeral 108 in FIGS. 1 and 2) of the device 100 with a portion 402 extending inwardly of the pocket 400 in the form of a shelf (referred to hereafter as a shelf portion).

Figure 5:
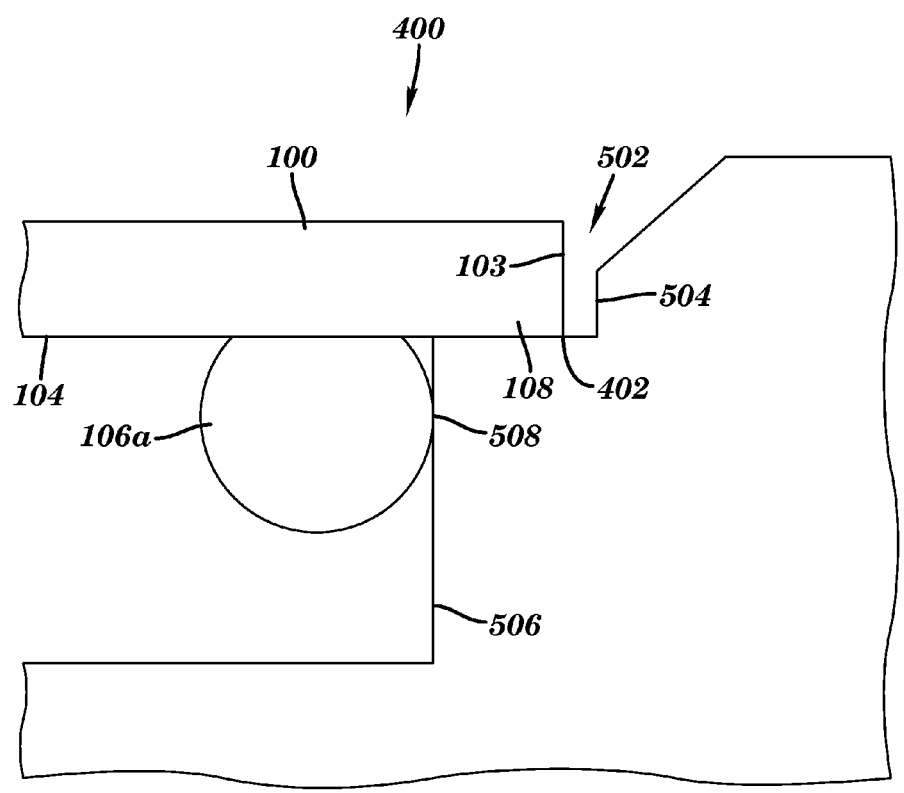
FIG. 5 is an enlarged partial cross-sectional view of the conventional pocket of FIG. 4.

FIG. 5 is an enlarged partial cross-sectional view of the conventional pocket of FIG. 4. In order to make the placement and removal operations easier and to accommodate devices of various dimensions, typically, there is a gap 502 between at least one of the opposing sides 103 of the semiconductor device 100 and an upper portion 504 of the inner sidewall surface of the conventional pocket illustrated in FIG. 5. Accordingly, during transportation, the device 100 may slide and the outermost ball terminals 106a may come into contact with a lower portion 506 (below shelf portion 402) of the inner sidewall surface of the conventional pocket 400. The point of contact is indicated by reference numeral 508 in FIG. 5. Such direct contact may damage ball terminals 106a. In some cases, such direct contact may lead to either partial or complete physical detachment of ball terminals 106a from the lower surface 104 of the device 100. Particularly, this problem becomes conspicuous in recent years because, as the semiconductor device 100 becomes increasingly compact, the width of the peripheral portion 108 of the lower surface 104 of the device 100 becomes narrow. As illustrated in FIG. 5, the lower portion 506 of the conventional pocket's 400 inner sidewall descends substantially vertically from the shelf portion 402.

Figure 6:
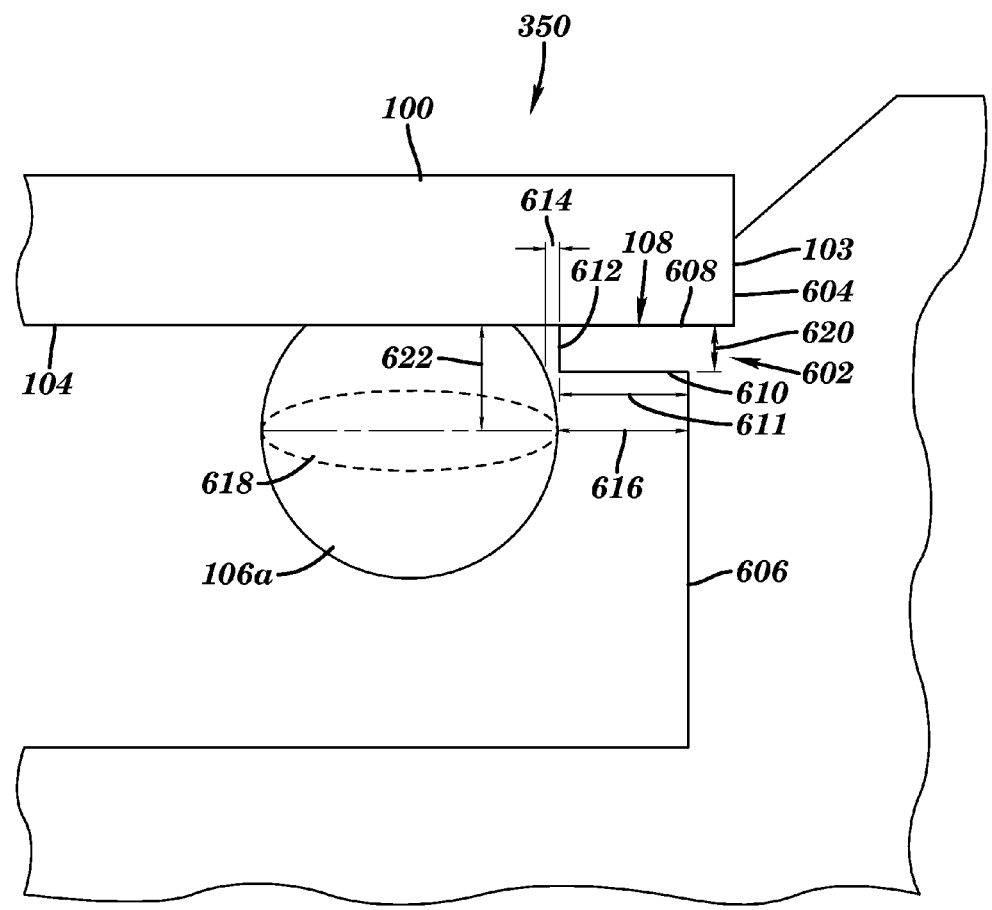
FIG. 6 is an enlarged partial cross-sectional view of a pocket of the tray of FIG. 3 in accordance with an embodiment of the invention.
Figure 7:
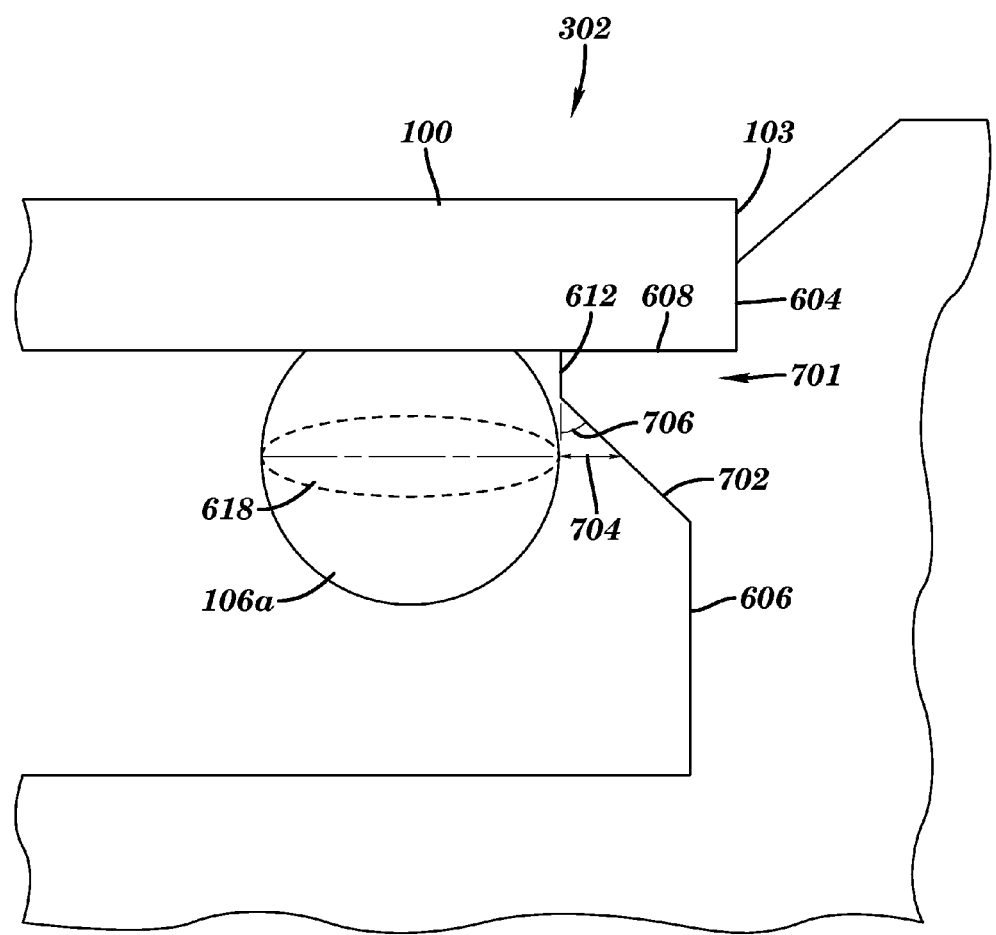
FIG. 7 is an enlarged partial cross-sectional view of a pocket of the tray of FIG. 3 in accordance with another embodiment of the invention.
Figure 8:
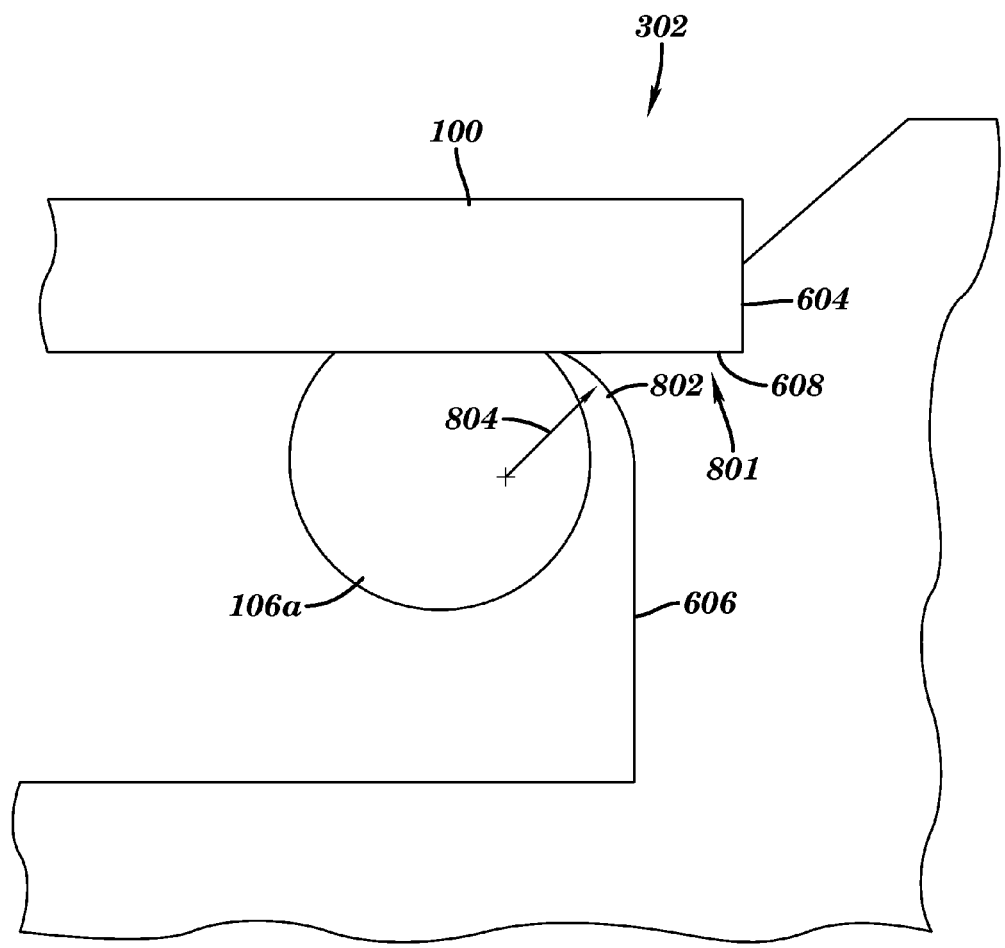
FIG. 8 is an enlarged partial cross-sectional view of a pocket of the tray of FIG. 3 in accordance with yet another embodiment of the invention.

FIGS. 6-8 illustrate various tray pocket structures that advantageously help prevent any damage to outermost ball terminals 106a during transportation. FIG. 6 is an enlarged partial cross-sectional view of a pocket of the tray of FIG. 3 in accordance with an embodiment of the invention. As illustrated in FIG. 6, a pocket, such as pocket 302 formed in the tray 300 for holding the semiconductor device 100, may include sidewalls having an upper portion 604 and a lower portion 606, and a shelf portion 602 located therebetween. The shelf portion 602 may extend horizontally inwardly from the upper portion 604. The shelf portion 602 acts to support a periphery 108 of the bottom surface 104 of the semiconductor device 100.

According to an embodiment illustrated in FIG. 6, the shelf portion 602 may have substantially planar upper and lower surfaces and an inner edge, indicated as reference numerals 608, 610, and 612 respectively. The thickness (depth of the inner edge 612) of the shelf portion 602 may be defined as a vertical distance 612 between the upper 608 and lower surfaces 610 of the shelf. Assume for purposes of illustration that in FIGS. 6-8 the bottom surface 104 of the semiconductor device 100 has a planar substantially square shape (for example, approximately 40 mm×40 mm) and that the solder ball 106a has a diameter of approximately 0.60 mm. According to this embodiment of the invention, thickness 620 of the shelf portion 602 may be approximately 0.11 mm. Length 611 of upper and lower surfaces of the shelf portion 602 may be approximately 0.06 mm. The lower portion 606 may descend substantially vertically from the lower surface 610 of the shelf portion 602.

In an embodiment of the invention, the receiving pockets 302 may be each formed with a square shape in plan. The shelf portions 602 may be provided at four corners 304 (shown in FIG. 3) of each pocket 302. However, various embodiments of the invention are not limited to this particular arrangement.

The pocket structure of this embodiment of the invention is an improvement over prior art as improved dimensions of the shelf portion 602 take advantage of the curvature of outermost solder ball 106a. FIG. 6 illustrates a state in which one of the opposing sides 103 of the semiconductor device 100 abuts the upper portion 604 of the pocket 302 as a result of sliding during transportation. This contact between the upper portion 604 of the pocket 302 and side edge 103 of the device 100 substantially stops the movement of the device 100 in a corresponding direction. Of note, in the illustrated state, a corresponding solder ball 106a along the peripheral edges 108 of the device 100, advantageously, is not in direct contact with any portion of the sidewalls. More specifically, when the side edge 103 of the semiconductor device 100 abuts the upper portion 604 of the pocket 302, the shelf portion 602 may be spaced apart from the closest solder ball 106a by a first distance 614 greater than zero and approximately equal to 0.05 mm. Similarly, the lower portion 606 of pocket's sidewall may be spaced apart from a great circle 618 of a closest solder ball 106a a second distance 616 approximately equal to 0.1 mm. For purposes of clarity, the term "great circle" is defined as a circle generated on the surface of a substantially spherical solder ball that divides the solder substantially equally into two hemispheres. Accordingly, the term "great circle" as used herein may also be accurately defined as the intersection of the surface of a substantially spherical solder ball with a plane passing through the center of the solder ball. Furthermore, the shelf portion 602 may be formed so that the thickness 620 of the shelf portion 602 is less than a distance between the bottom surface 104 of the semiconductor device 100 and the great circle 618 of a corresponding solder ball 106a along the peripheral edges 108 of the semiconductor device 100.

FIG. 7 is an enlarged partial cross-sectional view of a pocket of the tray of FIG. 3 in accordance with another embodiment of the invention. According to the embodiment illustrated in FIG. 7, the shelf portion 701 may be formed in such a manner that upper surface 608 is substantially planar and lower surface 702 is inclined downwardly from the inner edge 612 toward the lower portion 606 of pocket's sidewall. In other words, lower surface 702 of the shelf recedes away from the plurality of solder balls 106a. More specifically, lower surface 702 of the shelf portion 701 may be formed so as to be inclined at an angle 706 within a range between approximately 20 degrees and approximately 50 degrees with respect to the inner edge 612 of the shelf portion 701.

The pocket structure of this embodiment also advantageously keeps the plurality of solder balls 106a of the semiconductor device 100 from being brought into contact with any portion of pocket's sidewall when one of the opposing sides 103 of the device 100 is kept abutted against or in contact with the upper portion 604 of the pocket 302. More specifically, in this embodiment of the invention, when any of the side edges 103 of the semiconductor device 100 abuts the corresponding upper portion 604 of the pocket 302, the lower surface 702 of the shelf portion 701 may be spaced apart from the great circle 618 of the closest solder ball 106a by a third distance 704 ranging from approximately 0.06 mm to approximately 0.14 mm.

FIG. 8 is an enlarged partial cross-sectional view of a pocket of the tray of FIG. 3 in accordance with yet another embodiment of the invention. As illustrated in FIG. 8, pocket 302 formed in the tray 300 for holding the semiconductor device 100, may include sidewalls having an upper portion 604, a lower portion 606, a shelf portion 801, and a curved portion 802 located between the shelf portion 801 and the lower portion 606. In an embodiment of the invention the sidewalls of the pocket 302 may be formed as substantially continuous. Of note, in the current embodiment, the shelf portion 801 may include only the upper surface 608. Furthermore, curved portion 802 may be shaped to substantially conform to the curvatures of the plurality of solder balls 106a. For example, curved portion 802 may have a radius of curvature 804 of between approximately 0.35 mm and approximately 0.5 mm. The pocket structure of this embodiment also advantageously keeps the plurality of solder balls 106a along the peripheral edges 108 of the semiconductor device 100 from being brought into contact with any portion of pocket's sidewall or the shelf portion 801.

Thus, as described above, the embodiments of the invention disclosed herein relate to a tray for storing a semiconductor device of a ball grid array type. Advantageously, a change in the shape of various portions of sidewalls of the pocket and the shelf portion of the pocket, results in an increased distance between the shelf portion of the pocket (and/or the sidewalls of the pocket) and the plurality of solder balls along the peripheral edges of the stored device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A tray for storing a semiconductor device of a ball grid array type, the semiconductor device having opposing sides and a bottom surface including a plurality of solder balls protruding from the bottom surface along peripheral edges of the semiconductor device, the tray comprising:

a pocket formed in the tray for holding the semiconductor device, the pocket comprises sidewalls having an upper portion and a lower portion, and a shelf portion located therebetween, the shelf portion having substantially horizontal upper and lower surfaces and an inner edge comprising a vertical wall located therebetween, wherein the shelf portion extends horizontally inwardly from the upper portion, the shelf portion configured to receive a portion of the peripheral edges of the semiconductor device; and a notch comprising the lower portion of the sidewalls of the pocket and the lower surface of the shelf, the lower portion of the sidewalls descending substantially vertically from the lower surface of the shelf such that the notch is formed beneath the shelf portion, wherein the notch is spaced apart from the plurality of solder balls along the peripheral edges of the semiconductor device when one of the opposing sides of the semiconductor device abuts the upper portion of the sidewalls of the pocket.

2. The tray of claim 1, wherein an inner edge of the notch is spaced apart from a corresponding solder ball of the plurality of solder balls along the peripheral edges a distance approximately equal to 0.05 mm.

3. The tray of claim 1, wherein the lower portion of the sidewalls of the pocket is spaced apart from a great circle of a corresponding solder ball of the plurality of solder balls along the peripheral edges a distance approximately equal to 0.1 mm.

4. The tray of claim 1, wherein a thickness of the shelf portion of the pocket is less than a distance between the bottom surface of the semiconductor device and a great circle of a corresponding solder ball of the plurality of solder balls along the peripheral edges of the semiconductor device.

5. The tray of claim 1, wherein a thickness of the shelf portion of the pocket is approximately equal to 0.11 mm.

6. The tray of claim 1, wherein the shelf portion of the pocket has a substantially horizontal upper surface, a downwardly descending lower surface and wherein the inner edge of the shelf portion comprises a vertical wall located therebetween.

7. The tray of claim 6, wherein the downwardly descending lower surface of the shelf portion of the pocket has an inclination ranging from approximately 20 degrees to approximately 50 degrees with respect to the inner edge of the shelf portion of the pocket.

8. The tray of claim 6, wherein the downwardly descending lower surface of the shelf portion is spaced apart from a great circle of a corresponding solder ball of the plurality of solder balls along the peripheral edges a distance ranging from approximately 0.06 mm to approximately 0.14 mm.

9. The tray of claim 1, wherein the sidewalls of the pocket have an upper portion, a lower portion, and a curved portion, and wherein the curved portion of the sidewalls is located between the shelf portion of the pocket and the lower portion of the sidewalls.

10. The tray of claim 9, wherein the sidewalls of the pocket and the shelf portion of the pocket are substantially continuous.

11. The tray of claim 9, wherein the curved portion of the sidewalls has a radius of curvature of between approximately 0.35 mm and approximately 0.5 mm.

12. The tray of claim 9, wherein a contour of the curved portion of the sidewalls substantially conforms to a contour of a corresponding solder ball of the plurality of solder balls along the peripheral edges.

13. The tray of claim 1, wherein the pocket has a substantially square shape in a plane.

14. The tray of claim 1, wherein the tray has a substantially rectangular shape in a plane.

15. The tray of claim 14, wherein a length of the tray is approximately 323 mm, a width of the tray is approximately 136 mm, and a height of the tray is approximately 8 mm.

16. The tray of claim 1, wherein the shelf portion of the pocket is formed at each interior corner of the pocket.

* * * * *